(12) United States Patent
Khan et al.

(10) Patent No.: US 7,388,422 B2
(45) Date of Patent: Jun. 17, 2008

(54) CHARGE PUMP CIRCUIT FOR HIGH SIDE DRIVE CIRCUIT AND DRIVER DRIVING VOLTAGE CIRCUIT

(75) Inventors: Qadeer A. Khan, New Delhi (IN);
Hidetaka Fukazawa, Miyagi (JP);
Tushar S. Nandurkar, Uttar Pradesh (IN)

(73) Assignee: Freescale Semiconductor, Inc., Austin, TX (US)

( * ) Notice: Subject to any disclaimer, the term of this patent is extended or adjusted under 35 U.S.C. 154(b) by 205 days.

(21) Appl. No.: 11/441,415

(22) Filed: May 25, 2006

(65) Prior Publication Data

US 2006/0267671 A1    Nov. 30, 2006

(30) Foreign Application Priority Data

May 27, 2005   (IN)   .................. 1373/DEL/2005

(51) Int. Cl.
*G06F 1/10*   (2006.01)
(52) U.S. Cl. ....................................... 327/536; 327/112
(58) Field of Classification Search ......... 327/108–112, 327/536; 363/59–60
See application file for complete search history.

(56) References Cited

U.S. PATENT DOCUMENTS

| | | | | |
|---|---|---|---|---|
| 5,241,502 A | * | 8/1993 | Lee et al. ...................... | 365/203 |
| 5,489,870 A | * | 2/1996 | Arakawa .................... | 327/536 |
| 5,801,577 A | * | 9/1998 | Tailliet ........................ | 327/536 |
| 5,815,446 A | * | 9/1998 | Tobita .................... | 365/189.09 |
| 6,204,700 B1 | * | 3/2001 | Seyed .......................... | 327/108 |
| 6,242,970 B1 | * | 6/2001 | Grant et al. .................. | 327/536 |
| 6,400,210 B2 | | 6/2002 | Myono | |
| 6,559,689 B1 | * | 5/2003 | Clark .......................... | 327/97 |
| 6,847,237 B2 | * | 1/2005 | Kernhof et al. ............. | 327/110 |
| 6,885,225 B2 | * | 4/2005 | Ohmichi et al. ............. | 327/112 |
| 6,888,399 B2 | * | 5/2005 | Nakagawa et al. .......... | 327/536 |
| 7,106,012 B2 | * | 9/2006 | Matsuda et al. ............. | 318/139 |
| 7,265,606 B1 | * | 9/2007 | Suzuki ....................... | 327/536 |
| 2002/0145893 A1 | | 10/2002 | Yamamoto | |
| 2003/0193364 A1 | * | 10/2003 | Liu et al. .................... | 327/536 |
| 2004/0207453 A1 | | 10/2004 | Kernhof et al. | |
| 2004/0227564 A1 | | 11/2004 | Mayama et al. | |
| 2005/0017768 A1 | | 1/2005 | de Frutos et al. | |

* cited by examiner

*Primary Examiner*—N. Drew Richards
*Assistant Examiner*—Thomas J Hiltunen
(74) *Attorney, Agent, or Firm*—Charles Bergere

(57) ABSTRACT

A charge pump circuit for a high side drive circuit and a driver driving voltage circuit that stably output a voltage when input voltage is low. The charge pump circuit includes first and second transistors, first and second capacitors, and first to third diodes. The first capacitor has a high voltage side, connected to a load driving power supply voltage via the first diode, and a low voltage side, connected to the load driving power supply voltage via the first transistor or grounded via the second transistor driven in synchronization with the first transistor. The high voltage side is supplied, via the third diode, with a low side drive voltage that is as an output voltage of a low side charge pump, and functions to output high side drive voltage to a high side pre-driver circuit via the second diode.

4 Claims, 4 Drawing Sheets

US 7,388,422 B2

CHARGE PUMP CIRCUIT FOR HIGH SIDE DRIVE CIRCUIT AND DRIVER DRIVING VOLTAGE CIRCUIT

BACKGROUND OF THE INVENTION

The present invention relates to a charge pump circuit for a high side drive circuit and a driver driving voltage circuit, which are applicable to bridge configurations, such as a half bridge and a full bridge.

Bridge configurations, such as a full bridge and a half bridge, are used as drive circuits for driving motors and other devices. Japanese Laid-Open Patent Publication No. 2000-82946 describes a drive circuit having a full bridge (H bridge) configuration that is effective for use in a wide range of power supply voltages. Such a full bridge drive circuit includes a high side metal oxide semiconductor (MOS) transistor and a low side MOS transistor. The drain terminal of the high side MOS transistor is supplied with power supply voltage for driving a load. The source terminal of the low side MOS transistor is grounded. A drive output terminal OP is formed at a connecting node between the high side MOS transistor and the low side MOS transistor. The subject that is to be driven (drive subject) is connected to the drive output terminal OP. Further, a pre-driver circuit is connected to the gate of each MOS transistor.

The voltage supplied to the gate of each MOS transistor may be raised using a charge pump circuit including a plurality of capacitors. Such a charge pump circuit is used to supply voltage to a circuit that requires voltage that is higher than the supply voltage, such as a motor driver. FIG. 6 shows an example of the charge pump circuit. The charge pump circuit includes capacitors C11 and C12, and switches S1, S2, and S3. At time CLK, the switch S1 is activated, the switch S2 is inactivated, and the switch S3 is grounded. This charges the capacitor 11 and generates a capacitor charge voltage Vc. The capacitor charge voltage Vc is controlled by changing the length of the time CLK. When the time CLK is long enough, the capacitor charge voltage Vc is equal to input voltage Vin (Vc=Vin).

At time CLKB, the switch S1 is inactivated, the switch S2 is activated, and the switch S3 is switched to the side of the voltage Vin so that the capacitor charge voltage Vc and the input voltage Vin are in series. As a result, the output voltage is equal to the sum of the capacitor charge voltage Vc and the input voltage Vin (Vout=Vc+Vin). When the capacitor charge voltage Vc is equal to the input voltage Vin (Vc=Vin), the charge pump circuit outputs an output voltage that is two times greater than the input voltage (2vin). Further, when the charge pump circuit includes n stages of capacitors, the circuit outputs an output voltage that is n+1 times greater than the input voltage ((n+1)Vin).

The switches S1, S2, and S3 are usually formed by MOS transistors, which have low on-resistance. However, in a charge pump circuit used to drive a load with a high power supply voltage, the gate to source voltage of a MOS transistor may become extremely high and cause gate oxide breakdown. To prevent this, diodes may be used as the switches S1, S2, and S3 in lieu of MOS transistors.

However, when diodes are used, rising voltage (Vd) causes a voltage drop (Vd). This does not occur when using MOS transistors. Voltage drops occurring in the switches S1 and S2 amount to 2 Vd. The load driving power supply voltage is normally greater than 2 Vd. Thus such a voltage drop would not cause any problems. However, when the load driving power supply voltage decreases, the voltage drop may disable the driving of the high side charge pump circuit. In such a case, the threshold voltage for a transistor in a high side drive circuit would not be obtained. This would destabilize switching.

SUMMARY OF THE INVENTION

It is an object of the present invention to provide a charge pump circuit for a high side drive circuit and a driver driving voltage circuit that stably output voltage at a predetermined value or greater even when the input voltage is low.

One aspect of the present invention is a high side charge pump circuit for supplying voltage to a high side switch drive circuit. The high side charge pump circuit is used together with a low side switch drive voltage-raising circuit for supplying output voltage to a bridge drive circuit. The high side charge pump circuit includes a first switching device. A capacitor has a first terminal supplied with input voltage via the first switching device. A second switching device is connected to the first terminal of the capacitor and to an output terminal of the high side charge pump circuit. A third switching device selectively grounds the capacitor or supplies the input voltage to the capacitor synchronously with the supply of the input voltage to the first switching device or synchronously with stopping of the supply of the input voltage to the first switching device. A supply section, connected to the first terminal of the capacitor, supplies the output voltage of the low side switch drive voltage-raising circuit to the capacitor.

A further aspect of the present invention is a driver driving voltage circuit for driving a driver that drives a drive subject. The driver driving voltage circuit includes a high side switch drive circuit for controlling input voltage supplied to a drive output terminal that is connected to the drive subject. A charge pump circuit supplies voltage to the high side switch drive circuit. A low side switch drive circuit controls grounding of the drive output terminal. A low side switch drive voltage-raising circuit supplies voltage to the low side switch drive circuit. The high side charge pump circuit includes a first switching device. A capacitor has a first terminal supplied with input voltage via the first switching device. A second switching device is connected to the first terminal of the capacitor and to an output terminal of the high side charge pump circuit. A third switching device selectively grounds the capacitor or supplies the input voltage to the capacitor synchronously with the supply of the input voltage to the first switching device or synchronously with stopping of the supply of the input voltage to the first switching device. A supply section, connected to the first terminal of the capacitor, supplies the output voltage of the low side switch drive voltage-raising circuit to the capacitor.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
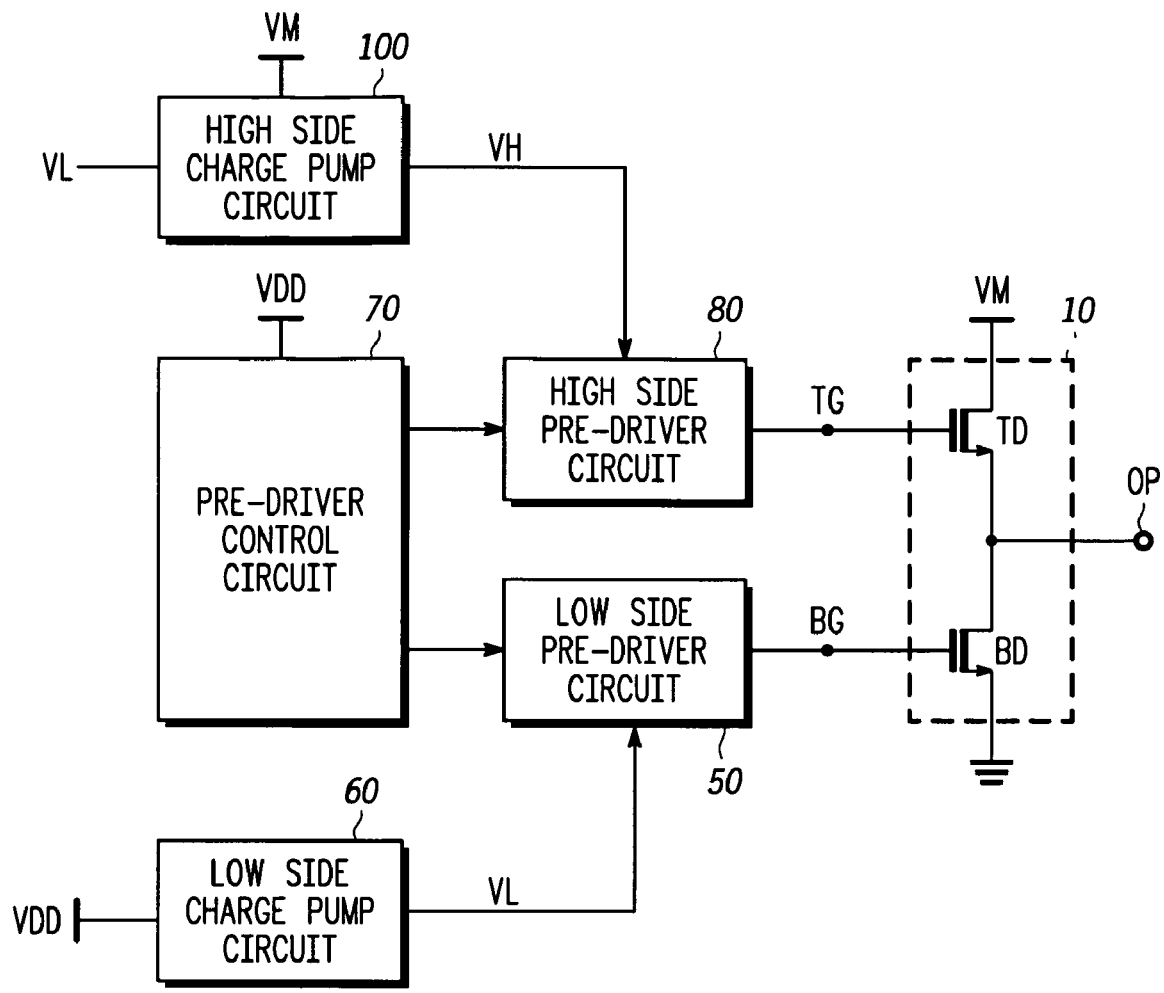
FIG. 1 is a circuit diagram of a drive circuit having a half bridge configuration according to a preferred embodiment of the present invention.

A preferred embodiment of the present invention will now be described with reference to FIGS. 1 to 5. In the preferred embodiment, a high side charge pump circuit 100 of the present invention is used to supply voltage to a drive circuit 10 having a half bridge configuration as shown in FIG. 1. The drive circuit 10 functions as a bridge drive circuit.

The drive circuit 10 having a half bridge configuration, as shown in FIG. 1, will first be described. The drive circuit 10 includes a MOS transistor TD and a MOS transistor BD. The MOS transistor TD functions as a top driver (high side switch). The MOS transistor BD functions as a bottom driver (low side switch). The MOS transistors TD and BD are formed by N-channel power MOS transistors.

The bottom driver MOS transistor BD controls connection to the ground. The MOS transistor BD has a source terminal (current output terminal) that is grounded and a drain terminal that is connected to a drive output terminal OP. A drive subject (not shown) is connected to the drive output terminal OP. Further, a low side pre-driver circuit 50, which functions as a low side switch drive circuit, is connected to the gate terminal of the MOS transistor BD (hereafter referred to as the "bottom gate BG"). The low side pre-driver circuit 50 is connected to a low side charge pump circuit 60, which functions as a low side switch drive voltage-raising circuit. The low side pre-driver circuit 50 is supplied with a low side drive voltage VL. The low side drive voltage VL is supplied to the bottom gate BG at a predetermined timing in accordance with a control signal provided from a pre-driver control circuit 70. Application of the low side drive voltage VL from the low side pre-driver circuit 50 to the bottom gate BG activates the MOS transistor BD. This results in the potential at the drive output terminal OP becoming equal to the ground potential.

Figure 6:
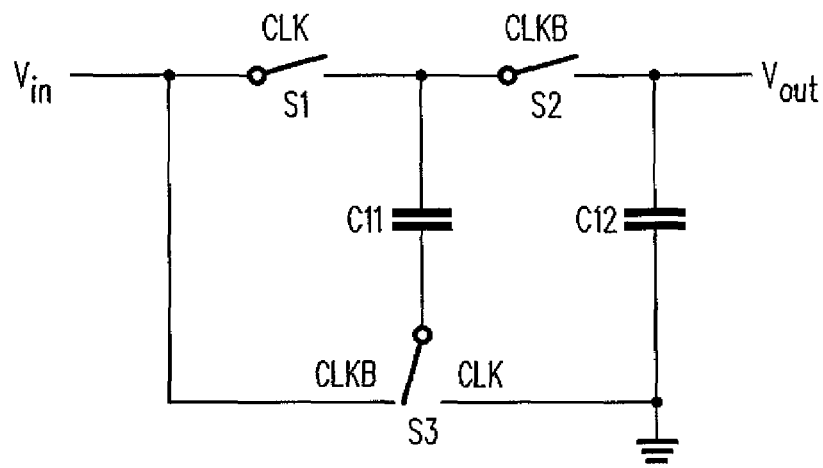
FIG. 6 is a circuit diagram describing a voltage-raising principle of a charge pump circuit.

The low side charge pump circuit 60 is supplied with power supply voltage VDD. The low side charge pump circuit 60 raises the power supply voltage VDD in the manner described with reference to FIG. 6, and outputs the raised voltage as the low side drive voltage VL.

The MOS transistor TD, which functions as the top driver, has a source terminal connected to the drive output terminal OP and to the drain terminal (current input terminal) of the MOS transistor BD. The MOS transistor TD has a drain terminal supplied with a load driving power supply voltage VM as an input voltage. A high side pre-driver circuit 80, which functions as a high side switch drive circuit, is connected to the gate terminal of the MOS transistor TD (hereafter referred to as the "top gate TG"). The high side pre-driver circuit 80 is connected to a high side charge pump circuit 100, which functions as a charge pump circuit of the high side switch drive circuit, and is supplied with high side drive voltage VH. The high side drive voltage VH is supplied to the top gate TG at a predetermined timing in accordance with a control signal provided from the pre-driver control circuit 70. The MOS transistor TD is activated when the high side drive voltage VH applied to the top gate TG is greater than a source terminal voltage threshold. As a result, the load driving power supply voltage VM is supplied to the drive output terminal OP.

In the preferred embodiment, the low side pre-driver circuit 50, the low side charge pump circuit 60, the pre-driver control circuit 70, the high side pre-driver circuit 80, and the high side charge pump circuit 100 configure a driver driving voltage circuit.

The configuration of the high side charge pump circuit 100 of the present invention will now be described with reference to FIG. 2.

The high side charge pump circuit 100 includes two transistors M1 and M2. In the preferred embodiment, N-channel power MOS transistors are used as the transistors M1 and M2.

The transistor M1 has a drain terminal connected to the anode of the diode D1. The drain terminal of the transistor M1 is supplied with the load driving power supply voltage VM. Further, the source terminal of the transistor M1 is connected to the drain terminal of the transistor M2 via a node CL. The transistor M2 has a source terminal that is grounded. In the preferred embodiment, a first switching device is configured by the diode D1, and a third switching device is configured by the transistors M1 and M2.

A first terminal of a capacitor C1 is connected to the cathode of the diode D1 via node CH. The capacitor C1 has a second terminal connected via the node CL to the source terminal of the transistor M1 and to the drain terminal of the transistor M2.

A supply section is further connected to the node CH. More specifically, the cathode of a diode D3 is connected to the node CH. The anode of the diode D3 is connected to the output terminal of the low side charge pump circuit 60 and supplied with the low side drive voltage VL.

The anode of a diode D2, which configures the second switching device, is connected to the node CH. The cathode of the diode D2 is supplied with the load driving power supply voltage VM via the capacitor C2. The potential at the cathode of the diode D2 is output as the high side drive voltage VH, which is the output of the high side charge pump circuit 100. The high side drive voltage VH is supplied to the high side pre-driver circuit 80 shown in FIG. 1.

The gate terminals of the transistors M1 and M2 are connected to the charge pump control circuit 200. The charge pump control circuit 200 provides the gate terminals of the transistors M1 and M2 with a signal to control the transistors M1 and M2 and control the charging of the capacitor C1.

The charge pump control circuit 200 is supplied with the low side drive voltage VL output from the low side charge pump circuit 60, the load driving power supply voltage VM, and the high side drive voltage VH output from the high side charge pump circuit 100. The charge pump control circuit 200 detects these voltages and adjusts the timing for driving the transistors M1 and M2 based on the detected voltages. In the preferred embodiment, when the load driving power supply voltage VM is greater than or equal to the low side drive voltage VL (i.e., VM≧VL) the charge pump control circuit 200 adjusts the drive timing of the transistors M1 and M2 so that the high side drive voltage VH becomes equal to a voltage obtained by adding the low side drive voltage VL and the load driving power supply voltage VM (i.e., VH=VL+VM).

The operation of the high side charge pump circuit 100 will now be described with reference to FIGS. 3 to 5. It is preferred that the voltage drop in the preferred embodiment is the same value (Vd) for each of the diodes D1, D2, and D3.

[Example when the load driving power supply voltage VM is greater than or equal to the low side drive voltage VL (VM≧VL)]

First, the operation of the high side charge pump circuit 100 when the load driving power supply voltage VM is greater than or equal to the low side drive voltage VL will be described.

The charge pump control circuit 200 synchronously controls the transistors M1 and M2. More specifically, the charge pump control circuit 200 inactivates the transistor M1 and activates the transistor M2. In this case, the node CL is grounded, the capacitor C1 is supplied with the load driving power supply voltage VM, and the maximum voltage at the node CH becomes equal to a value obtained by subtracting the voltage drop of the diode D1 from the load driving power supply voltage VM (VM−Vd). In this case, the capacitor C1 is charged up to the maximum voltage (VM−Vd).

Further, the charge pump control circuit 200 synchronously controls the transistors M1 and M2 to inactivate the transistor M2 and activate the transistor M1. This supplies the node CL with the load driving power supply voltage VM via the transistor M1. In this case, the maximum voltage at the node CH becomes equal to a value obtained by adding the load driving power supply voltage VM to the capacitor charge voltage Vc (VM+Vc=2 VM−Vd).

This increases the voltage at the node CH. The diode D1 is inactivated and the diode D2 is activated. This causes current to flow from the node CH to the capacitor C2. As a result, the high side drive voltage VH becomes a potential obtained by adding the load driving power supply voltage VM to the voltage at the capacitor C2. In the preferred embodiment, the charge pump control circuit 200 adjusts the drive timing of the transistors M1 and M2 so that the high side drive voltage VH becomes equal to a voltage obtained by adding the low side drive voltage VL to the load driving power supply voltage VM (i.e., VH=VL+VM).

The high side pre-driver circuit 80 shown in FIG. 1 applies the high side drive voltage VH supplied from the high side charge pump circuit 100 to the top gate TG. Thus, even when the load driving power supply voltage VM is applied to the drain terminal of the MOS transistor TD included in the drive circuit 10, the voltage applied to the gate terminal of the MOS transistor TD is higher than the load driving power supply voltage VM. This ensures that the switching operation is performed.

Figure 3:
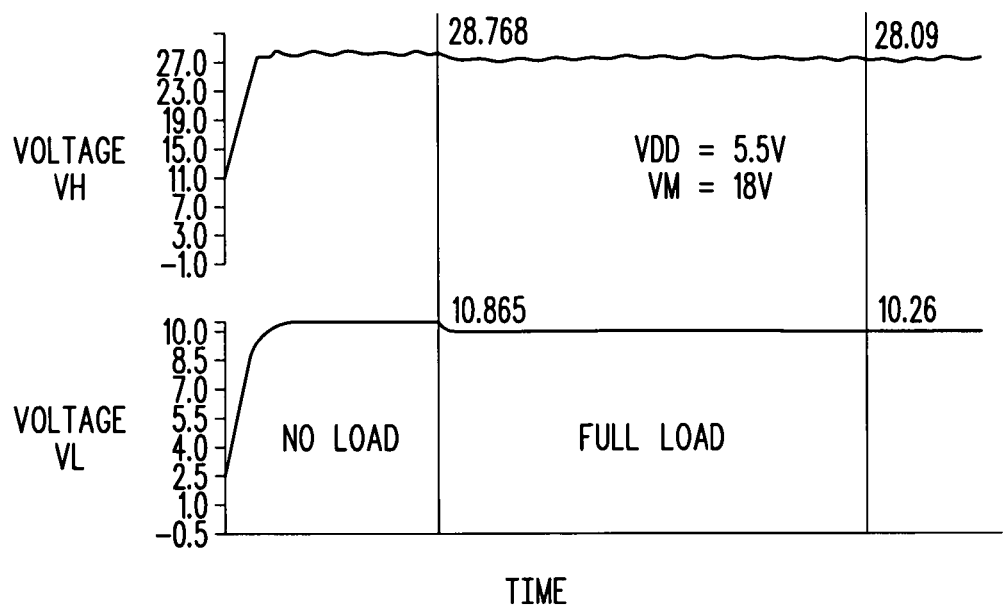
FIG. 3 is a diagram showing voltage characteristics when power supply voltage for the drive circuit is greater than or equal to a low side drive voltage.
Figure 4:
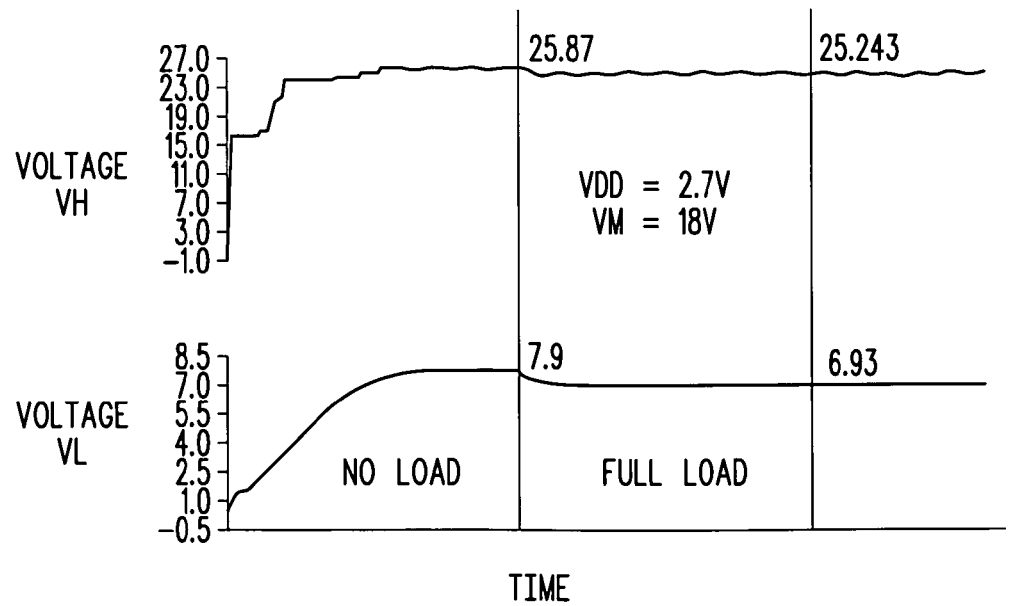
FIG. 4 is a diagram showing voltage characteristics when the power supply voltage for the drive circuit is greater than or equal to the low side drive voltage.

FIGS. 3 and 4 show voltage characteristics when the load driving power supply voltage VM is greater than or equal to the low side drive voltage VL.

FIG. 3 shows a simulation result of the high side drive voltage VH and the low side drive voltage VL when the load driving power supply voltage VM is 18 V and the power supply voltage VDD is 5.5 V. The low side drive voltage VL is obtained by raising the power supply voltage VDD. The low side drive voltage VL is about 11 V in a state in which there is no load and the pre-driver control circuit 70 is not driven. Further, the low side drive voltage VL is about 10 V in a state in which there is a load and the pre-driver control circuit 70 is driven. The high side drive voltage VH is substantially equal to a value obtained by adding the load driving power supply voltage VM to the low side drive voltage VL.

FIG. 4 shows a simulation result of the high side drive voltage VH and the low side drive voltage VL when the load driving power supply voltage VM is 18 V and the power supply voltage VDD is 2.7 V. The low side drive voltage VL is obtained by raising the power supply voltage VDD. The low side drive voltage VL is about 8 V in a state in which there is no load and the pre-driver control circuit 70 is not driven. Further, the low side drive voltage VL is about 7 V in a state in which there is a load and the pre-driver control circuit 70 is driven. The high side drive voltage VH is substantially equal to a value obtained by adding the load driving power supply voltage VM to the low side drive voltage VL.

[Example when the load driving power supply voltage VM is lower than the low side drive voltage VL (VM<VL)]

Next, the operation of the high side charge pump circuit 100 when the load driving power supply voltage VM is lower than the low side drive voltage VL will be described.

Figure 2:
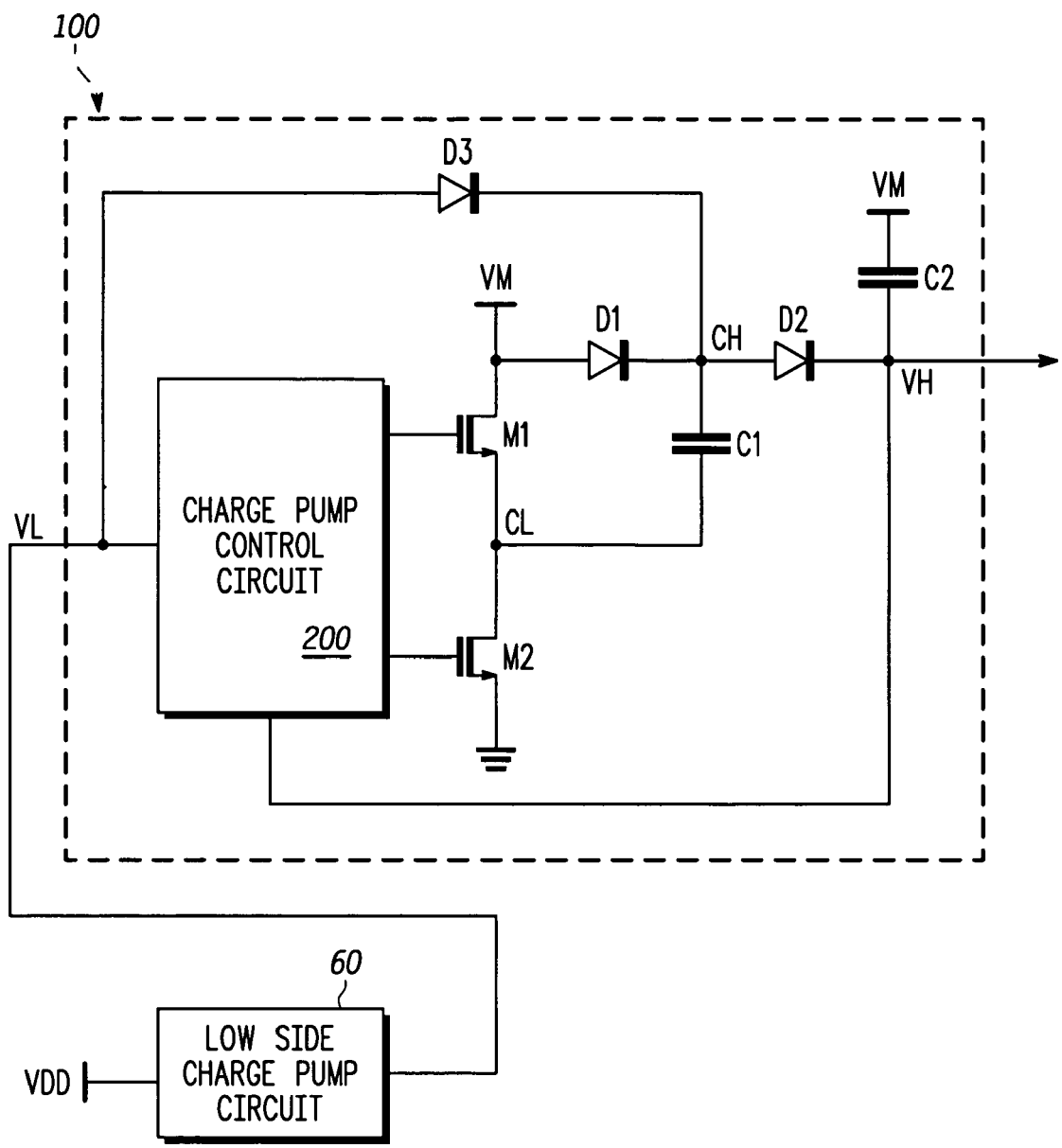
FIG. 2 is a circuit diagram of a high side charge pump circuit according to the preferred embodiment of the present invention.

Referring to FIG. 2, in the same manner as described above, the charge pump control circuit 200 synchronously controls the transistors M1 and M2. More specifically, the charge pump control circuit 200 inactivates the transistor M1 and activates the transistor M2. When the load driving power supply voltage VM is lower than the low side drive voltage VL, the diode D1 is inactivated, and the low side drive voltage VL is supplied to the node CH via the diode D3. As a result, the capacitor C2 is charged up to a voltage equal to a value obtained by subtracting the voltage drop of the diode D3 from the voltage at the node CH (VL−Vd).

In this state, if the high side drive voltage VH is lower than the potential at the node CH, current flows to the capacitor C2 via the diode D2. This charges the capacitor C2.

Subsequently, the charge pump control circuit 200 synchronously controls the transistors M1 and M2 to inactivate the transistor M2 and activate the transistor M1. This supplies the node CL with the load driving power supply voltage VM via the transistor M1. Thus, the voltage at the node CH becomes equal to a value obtained by adding the load driving power supply voltage VM to the charge voltage (VL−Vd) of the capacitor C1 (VM+VL−Vd). As a result, current flows from the node CH to the capacitor C2 via the diode D2. This causes the high side drive voltage VH to become equal to a potential obtained by adding the load driving power supply voltage VM and the voltage at the capacitor C2.

The capacitor C1 is charged only up to voltage VL−Vd. Thus, the high side drive voltage VH is equal to a voltage (VM+VL−2 Vd) that is obtained by subtracting the voltage drop of the diode D2 from the voltage (VM+VL−Vd) at the node CH. Accordingly, even when the load driving power supply voltage VM is low, the high side drive voltage VH, which drives the top driver MOS transistor TD, is generated as a voltage that is greater than or equal to a predetermined value.

Figure 5:
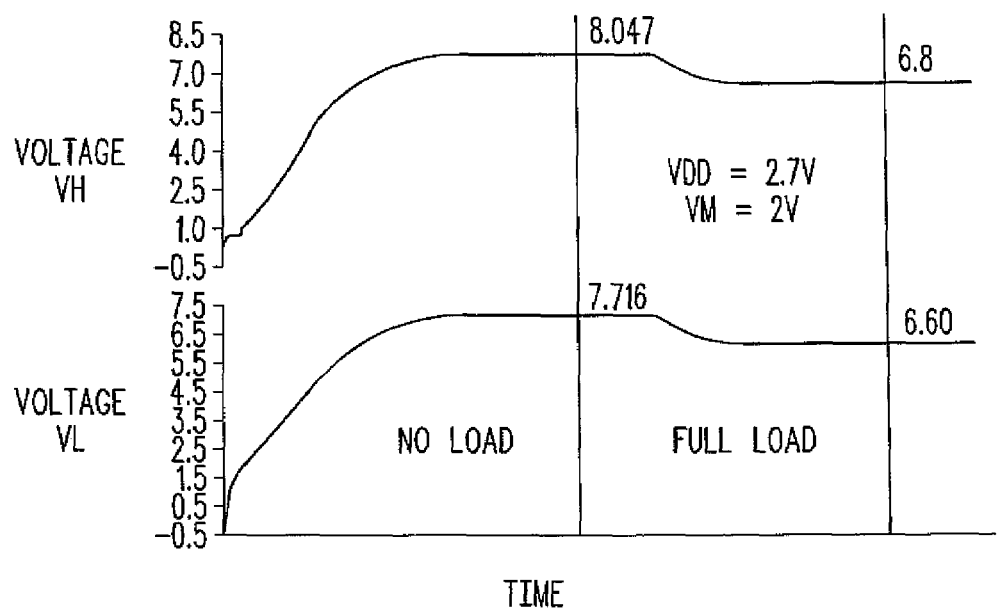
FIG. 5 is a diagram showing voltage characteristics when the power supply voltage for the drive circuit is lower than the low side drive voltage.

FIG. 5 shows voltage characteristics when the load drive power supply voltage VM is lower than the low side drive voltage VL.

FIG. 5 shows a simulation result of the high side drive voltage VH and the low side drive voltage VL when the load driving power supply voltage VM is 2 V and the power supply voltage VDD is 2.7 V. The low side drive voltage VL, which is about three times greater than the power supply voltage VDD, is about 7.7 V in state in which there is no load and the pre-driver control circuit 70 is not driven, and is about 6.6 V in a state in which there is a load and the pre-driver control circuit 70 is driven. It is assumed that the voltage drop of each of the diodes D3 and D2 is about 0.8 V. In this case, the high side drive voltage VH is substantially equal to a value obtained by subtracting resistance voltages of the diodes D3 and D2 from the sum of the load driving power supply voltage VM and the low side drive voltage VL (VL+VM−2 Vd). More specifically, the high side drive voltage VH is about 8 V when there is no load and about 7 V when there is a load.

When the low side drive voltage VL is not supplied via the diode D3, the charge voltage of the capacitor C1 would be equal to the load driving power supply voltage VM, that is, 2

V. Further, the voltage at the node CH would be 4 V. However, the voltage drop value of the diode D3 must be subtracted from the voltage at the node CH. As a result, only 3.2 V would be output as the high side drive voltage VH.

The preferred embodiment has the advantages described below.

In the preferred embodiment, the node CH, to which the capacitor C1 is connected, is supplied with the low side drive voltage VL output from the low side charge pump circuit 60 via the diode D3. Even when the load driving power supply voltage VM changes and becomes lower than the low side drive voltage VL, the low side drive voltage VL is used to generate the high side drive voltage VH of a predetermined value or greater. Even in a circuit that is designed without expecting that the load driving power supply voltage VM would be decreased, the required high side drive voltage VH is ensured by simply arranging the diode D3 in the existing charge pump circuit. This ensures that the switching operation of the top driver MOS transistor TD, of which drain terminal is supplied with the load driving power supply voltage VM, is performed.

In the preferred embodiment, the node CH is supplied with the load driving power supply voltage VM via the diode D1 and supplied with the low side drive voltage VL via the diode D3. Thus, the capacitor is charged in accordance with the greater one of the input voltage and the output voltage of the low side charge pump circuit. Such a simple configuration ensures that voltage of a predetermined value or greater is output as the output voltage of the high side charge pump circuit.

In the preferred embodiment, diodes are arranged between the load driving power supply voltage VM and the output terminal. This enables switching to be performed without causing gate breakdown under high voltages. Gate breakdown may occur if MOS transistors were to be used in such manner.

It should be apparent to those skilled in the art that the present invention may be embodied in many other specific forms without departing from the spirit or scope of the invention. Particularly, it should be understood that the present invention may be embodied in the following forms.

In the above embodiment, the diode D1, which functions as the first switching device, is arranged between the load driving power supply voltage VM and the node CH. However, a switching device having a high on-resistance may be arranged in the high side charge pump circuit 100 in lieu of the diode D1.

In the above embodiment, the low side charge pump circuit 60, which functions as a low side voltage-raising circuit for supplying voltage to the bottom driver MOS transistor BD of the drive circuit 10, is used together with the high side charge pump circuit 100. However, the present invention is not limited to such a configuration, and the low side voltage-raising circuit, which generates the low side drive voltage VL, may be a circuit other than a charge pump circuit. For example, the low side voltage-raising circuit may be a step-up converter.

In the above embodiment, the high side charge pump circuit 100 is used to apply voltage to the top gate TG of the drive circuit 10 having a half bridge configuration. However, the present invention is not limited to such a configuration. For example, the high side charge pump circuit 100 may be used to apply voltage to a drive circuit having another type of bridge configuration, such as a full bridge configuration.

In the above embodiment, the high side charge pump circuit 100 is used to generate voltage applied to the top gate TG of the drive circuit 10 having a bridge configuration. However, the present invention is not limited to such use. For example, the high side charge pump circuit 100 may be used to constantly keep the output voltage greater than or equal to a predetermined value, in which the output voltage is the sum of a voltage that varies greatly and a voltage that is lower than the varying voltage.

The present examples and embodiments are to be considered as illustrative and not restrictive, and the invention is not to be limited to the details given herein, but may be modified within the scope and equivalence of the appended claims.

What is claimed is:

1. A high side charge pump circuit for supplying voltage to a high side switch drive circuit, wherein the high side charge pump circuit is used together with a low side switch drive voltage-raising circuit for supplying output voltage to a bridge drive circuit, the high side charge pump circuit comprising:
   a first switching device;
   a capacitor having a first terminal supplied with input voltage via the first switching device;
   a second switching device connected to the first terminal of the capacitor and to an output terminal of the high side charge pump circuit;
   a third switching device for selectively grounding the capacitor or supplying the input voltage to the capacitor synchronously with the supply of the input voltage to the first switching device or synchronously with stopping of the supply of the input voltage to the first switching device;
   a supply section, connected to the first terminal of the capacitor, for supplying the output voltage of the low side switch drive voltage-raising circuit to the capacitor; and
   a charge pump control circuit for controlling the first and third switching devices;
   wherein when the input voltage is higher than the output voltage of the low side switch drive voltage-raising circuit, the charge pump control circuit controls the first and third switching devices based on the input voltage so that the capacitor is charged to a voltage obtained by subtracting a voltage drop that occurs in the second switching device from the output voltage of the low side switch drive voltage-raising circuit.

2. The high side charge pump circuit according to claim 1, wherein each of the first and second switching devices includes a diode.

3. The high side charge pump circuit according to claim 2, wherein the supply section supplies the output voltage of the low side switch drive voltage-raising circuit to the first terminal of the capacitor via a diode.

4. A driver driving voltage circuit for driving a driver that drives a drive subject, the driver driving voltage circuit comprising:
   a high side switch drive circuit for controlling input voltage supplied to a drive output terminal that is connected to the drive subject;
   a charge pump circuit for supplying voltage to the high side switch drive circuit;
   a low side switch drive circuit for controlling grounding of the drive output terminal; and
   a low side switch drive voltage-raising circuit for supplying voltage to the low side switch drive circuit,
   wherein the charge pump circuit includes:
      a first switching device;
      a capacitor having a first terminal supplied with input voltage via the first switching device;

a second switching device connected to the first terminal of the capacitor and to an output terminal of the high side charge pump circuit;

a third switching device for selectively grounding the capacitor or supplying the input voltage to the capacitor synchronously with the supply of the input voltage to the first switching device or synchronously with stopping of the supply of the input voltage to the first switching device;

a supply section, connected to the first terminal of the capacitor, for supplying the output voltage of the low side switch drive voltage-raising circuit to the capacitor; and a charge pump control circuit for controlling the first and third switching devices;

wherein when the input voltage is higher than the output voltage of the low side switch drive voltage-raising circuit, the charge pump control circuit controls the first and third switching devices based on the input voltage so that the capacitor is charged to a voltage obtained by subtracting a voltage drop that occurs in the second switching device from the output voltage of the low side switch drive voltage-raising circuit.

* * * * *